March 7, 1961 D. E. NORGAARD 2,974,288

D.-C. AMPLIFIER AND FILTER THEREFOR

Filed Oct. 9, 1957

INVENTOR.
Donald E. Norgaard
BY Flehr & Swain
ATTORNEYS

United States Patent Office 2,974,288

Patented Mar. 7, 1961

2,974,288

D.-C. AMPLIFIER AND FILTER THEREFOR

Donald E. Norgaard, Los Altos, Calif., assignor to Hewlett-Packard Company, Palo Alto, Calif., a corporation of California Filed Oct. 9, 1957, Ser. No. 689,093

2 Claims. (Cl. 330—10)

This invention relates generally to a D.-C. amplifier and filter therefor, and more particularly to an input filter for low level D.-C. amplifiers.

Many low level D.-C. amplifier systems include a chopper which serves to modulate or chop the D.-C. input signals to form an A.-C. signal which may be amplified by conventional A.-C. coupled amplifiers. The amplified signal is then demodulated to produce an output D.-C. voltage which is proportional to the input voltage. In general, D.-C. amplifiers of the type previously described, that is, which include an A.-C. amplifier, include feedback means which serve to feed back a predetermined amount of the output D.-C. signal to the modulator to stabilize the gain of the amplifier.

One source of considerable difficulty with the D.-C. amplifiers of the above character is A.-C. signal input (noise pickup) to the modulator. The A.-C. signal may lead to two types of complications: One, an erroneous reading may be obtained if the A.-C. signal is at or near the frequency of the moduator or a harmonic thereof; two, the A.-C. signal may be of sufficient magnitude to overload the amplifier and thus cause erroneous readings.

In general, prior art devices include a suitable filter which serves to filter out any A.-C. signal which might be applied to the modulator. A conventional low pass filter circuit is generally employed. A common difficulty is that the low level D.-C. signal must charge the capacitors of the circuit. As a result, the response of the system may become unnecessarily slow.

It is an object of the present invention to provide an improved low level D.-C. amplifier.

It is another object of the present invention to provide an improved filter structure for an amplifier of the above character.

It is still another object of the present invention to provide a filter arrangement which has relatively high attenuation for A.-C. signal input with, however, relatively low storage for D.-C. signal input, and which minimizes the value of the resistance or impedance of the series elements of the filter structure.

These and other objects of the present invention will become more clearly apparent from the following description taken in conjunction with the accompanying drawing.

Referring to the drawing.

Figure 1:
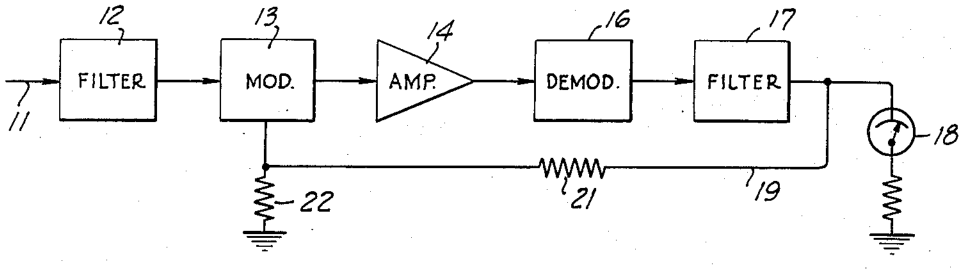
Figure 1 shows a conventional amplifier including D.-C. feedback.

Referring to Figure 1, the D.-C. input signal is applied along the line 11 to the filter 12. The filter 12 may be of a conventional type such as illustrated in Figure 3, or may be of the novel type to be presently described in conjunction with Figure 2. The filter 12 serves to filter any A.-C. signals which arise from stray pickup and the like. As previously described these signals may give false indications or overload the amplifier. The D.-C. output of the filter 12 is applied to a modulator 13 which serves to form an A.-C. signal suitable for amplification by the A.-C. amplifier 14. For example, the modulator 13 may be of the type described in copending application Serial No. 643,782, filed March 7, 1957, and which includes photoconductive elements disposed in a bridge circuit with opposite elements being alternately illuminated by a neon lamp. The modulator may also be of the well known mechanical type in which vibrating contacts serve to modulate the signal.

The amplifier 14 may be of the push-pull A.-C. multistage amplifier with internal negative feedback for stabilization. A suitable amplifier is described in said copending application. The amplifier therein described is a four stage balanced amplifier which includes negative feedback in the last three stages.

The A.-C. output of the amplifier 14 is applied to a demodulator 16 which may be of the type previously described or may be other well known types of demodulators such as a diode type demodulator. The output of the demodulator is a D.-C. signal which is proportional to its A.-C. input, taking due account of phase. This signal may, if desired, be applied to a low pass filter 17, of conventional construction, to reduce the magnitude of any A.-C. signal generated in or conveyed by the amplifier or demodulator. The output of the filter is shown to be applied to an indicating meter 18 which gives an indication proportional to the D.-C. signal input to the system.

To stabilize the system of Figure 1 against variations in tube characteristics and the like, a D.-C. feedback signal is applied from the output along the line 19 to the input to the demodulator. The signal applied to the modulator is attenuated by the resistors 21 and 22. As is apparent, the attenuated signal will have a magnitude which corresponds to the D.-C. output on conductor 19 times the ratio $$\frac{R_{22}}{R_{22}+R_{21}}$$

In general, the signal appearing at this point is made nearly equal to the input signal in the manner described below.

Operation of the feedback to stabilize the amplifier may be more clearly understood from the following: The net gain is given by $$K'=\frac{K}{1+K\beta}$$

where K is the gain of the amplifier without feedback and $\beta$ is the feedback ratio. If the gain of the amplifier is high, then K' equals approximately $1/\beta$, the feedback ratio. The magnitude of K is thus made relatively independent of changes in supply voltage, tube parameters and the like for this condition.

A typical two-section filter of the conventional type is shown in Figure 3. The filter comprises resistors 26 and 27 and capacitors 28 and 29. Any D.-C. input signal must charge the capacitors 28 and 29 to the applied potential before the full output appears across the output terminals. In general, the energy storage in each of the capacitors is equal to $$k\frac{(V_{C1})^2}{2C_1}$$

where $(V_{C1})$ is the voltage applied to the capacitor $C_1$; $k$ is a proportionality factor and $C_1$ is the capacitance of the capacitor. If the capacitors are relatively large, a condition frequently required for adequate low pass filtering, then the time required to charge the filter capacitors to input potential can be unnecessarily great. In particular, when a D.-C. signal from a high impedance source is applied, a considerable period of time is required for the capacitors to charge and for the output of the filter to each a stable value which is equal to the input D.-C. signal.

It is desirable for the filter device 12 to exhibit the property of high energy storage for A.-C. signals, while at the same time to have low energy storage for D.-C. signals. The speed of response is thereby increased to a practical maximum consistent with adequate input signal filtering. The novel circuit of the invention includes means for achieving this purpose.

Figure 2:
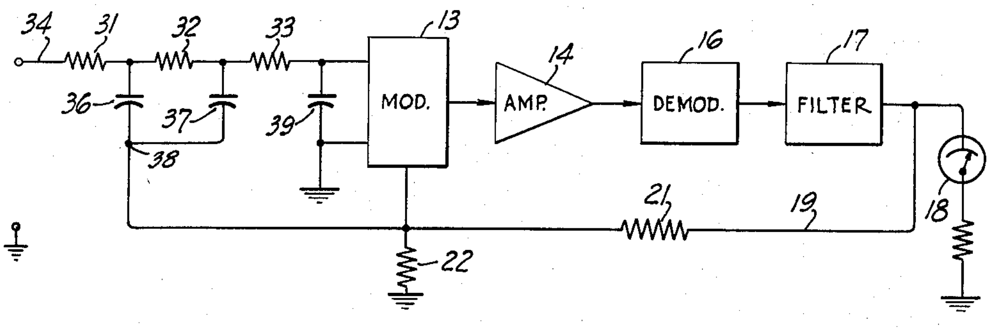
Figure 2 shows an amplifier similar to the one of Figure 1 but which includes the novel filter circuit of the invention.
Figure 3:
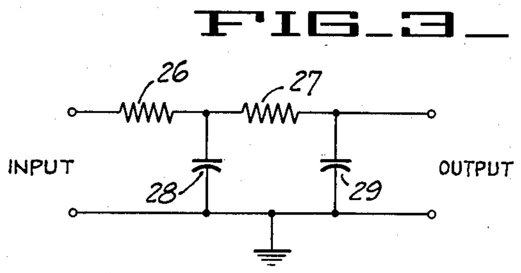
Figure 3 shows a conventional low pass filter circuit.

Referring now to Figure 2, a suitable filter circuit 12 is illustrated. The circuit includes serially connected resistors 31, 32 and 33, in the line 34. The common junctions of the resistors 31, 32 and 32, 33 are capacitively connected by the capacitors 36 and 37 to the point 38. A capacitor 39 connects one input lead of the modulator to ground. An input signal is applied between this ground point and conductor 34.

The feedback voltage applied to the modulator is also applied to the point 38. In general, as previously described, this voltage is almost equal to the input voltage. Thus, the voltage serves to raise the D.-C. level of the conductor 38 to a value corresponding almost exactly to the D.-C. level of the input signal applied to conductor 34. As a result, substantially no D.-C. charging current flows into capacitors 36 and 37. Almost all of the unidirectional input current flows directly into capacitor 39, which permits the input signal to be applied directly to the modulator 13. However, for A.-C. signals, the circumstances are entirely different. The capacitors 36, 37 are in series with the resistor 22 which has a relatively low value and, therefore, this side of the capacitors is essentially grounded for A.-C. currents.

Typical values for the components of the filter are as follows:

| | | |
|---|---|---|
| Resistors: | | |
| **31** | megohm | 1 |
| **32** | do | 0.5 |
| **33** | do | 0.1 |
| Capacitors: | | |
| **36** | microfarad | 0.1 |
| **37** | do | 0.1 |
| **39** | do | 0.1 |

Thus, it is seen that a novel type filter is supplied in which there is relatively low energy storage of D.-C. signals because a voltage is applied to the condensers to raise their voltage level whereby substantially no D.-C. charging current is required and yet the filter serves to effectively filter A.-C. signals. As a result, a filter which is highly effective and which has a rapid response is provided. The complete amplifier system can then be used in applications where a rapid response to changing D.-C. signals is required.

I claim:

1. A D.-C. amplifier system for input signals having A.-C. and D.-C. components, said system comprising a modulator having first and second input terminals, an A.-C. amplifier connected to said modulator and serving to amplify the modulated output signal of said modulator, a demodulator connected to said amplifier and serving to demodulate the amplified signal to form a D.-C. signal proportional to the D.-C. component of said input signal, an output device, means to apply said last named D.-C. signal to said output device, a feedback means including a potential divider comprising two resistances connected in series between the output of said demodulator and a point of fixed reference potential, said potential divider having a divider ratio such that the potential at the junction of said resistances with respect to said reference potential is substantially equal to the D.-C. component of said input signal with respect to said reference potential, a direct connection between the junction of said resistances and the second input terminal of said modulator, said system comprising also a low-pass input filter having an input terminal, said filter comprising two resistors connected in series between the input terminal of said filter and the first input terminal of said modulator, a capacitor connected from a point located between said last-named resistors to the junction of the two resistances of said potential divider, and a capacitor connected between the first input terminal of said modulator and said point of reference potential, and means to apply the signal to be amplified between the input terminal of said input filter and said point of reference potential.

2. A D.-C. amplifier system for input signals having A.-C. and D.-C. components, said system comprising a modulator having first and second input terminals, an A.-C. amplifier connected to said modulator and serving to amplify the modulated output signal of said modulator, a demodulator connected to said amplifier and serving to demodulate the amplified signal to form a D.-C. signal proportional to the D.-C. component of said input signal, an output device, means to apply said last-named D.-C. signal to said output device, a feedback means including a potential divider comprising two resistances connected in series between the output of said demodulator and a point of fixed reference potential, said potential divider having a divider ratio such that the potential at the junction of said resistances with respect to said reference potential is substantially equal to the D.-C. component of said input signal with respect to said reference potential, a direct connection between the junction of said resistances and the second input terminal of said modulator, said system comprising also a low-pass input filter having an input terminal, said filter comprising first, second and third resistors connected in series between the input terminal of said filter and the first input terminal of said moduator, said second resistor being connected between said first and third resistors, and said third resistor being connected between said second resistor and the first input terminal of said modulator, a first capacitor connected from a point located between said first and second resistors to the junction of the two resistances of said potential divider, a second capacitor connected from a point located between said second and third resistors to the junction of the two resistances of said potential divider, and a capacitor connected between the first input terminal of said modulator and said point of reference potential, and means to apply the signal to be amplified between the input terminal of said input filter and said point of reference potential.

References Cited in the file of this patent

UNITED STATES PATENTS

| | | |
|---|---|---|
| 2,297,543 | Eberhardt et al. | Sept. 29, 1942 |
| 2,490,579 | Clewell | Dec. 6, 1949 |
| 2,546,918 | Branson | Mar. 27, 1951 |
| 2,637,777 | Kilby et al. | May 5, 1953 |
| 2,688,729 | Offner | Sept. 7, 1954 |
| 2,724,022 | Williams et al. | Nov. 15, 1955 |
| 2,806,989 | Shoop | Sept. 17, 1957 |
| 2,884,597 | Miller | Apr. 28, 1959 |
| 2,903,523 | Toomim et al. | Sept. 8, 1959 |